(12) United States Patent
Otsuka et al.

(10) Patent No.: US 12,394,591 B2
(45) Date of Patent: Aug. 19, 2025

(54) CHARGED PARTICLE BEAM APPARATUS

(71) Applicant: JEOL Ltd., Tokyo (JP)

(72) Inventors: Takeshi Otsuka, Tokyo (JP); Sadahiko Mochizuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 403 days.

(21) Appl. No.: 18/112,687

(22) Filed: Feb. 22, 2023

(65) Prior Publication Data
US 2023/0274910 A1 Aug. 31, 2023

(30) Foreign Application Priority Data

Feb. 25, 2022 (JP) ................ 2022-028236

(51) Int. Cl.
*H01J 37/28* (2006.01)
*H01J 37/244* (2006.01)
*H01J 37/26* (2006.01)

(52) U.S. Cl.
CPC ............ *H01J 37/28* (2013.01); *H01J 37/244* (2013.01); *H01J 37/265* (2013.01); *H01J 2237/24475* (2013.01); *H01J 2237/2448* (2013.01)

(58) Field of Classification Search
CPC ........ H01J 37/28; H01J 37/244; H01J 37/265; H01J 37/24475; H01J 37/2448
See application file for complete search history.

(56) References Cited

U.S. PATENT DOCUMENTS

| | | | |
|---|---|---|---|
| 2020/0258713 A1* | 8/2020 | Mizuhara | ............ H01J 37/244 |
| 2021/0210306 A1 | 7/2021 | Zeidler et al. | |
| 2022/0037112 A1 | 2/2022 | Tani et al. | |

FOREIGN PATENT DOCUMENTS

| | | | |
|---|---|---|---|
| CN | 113299529 A | 8/2021 | |
| JP | S61131352 A | 6/1986 | |
| JP | H0197074 A | 4/1989 | |
| JP | H09134696 A | 5/1997 | |
| JP | 2019163980 A | 9/2019 | |
| WO | 2020100205 A1 | 5/2020 | |
| WO | WO-2022248141 A1 * | 12/2022 | ............ H01J 37/153 |

OTHER PUBLICATIONS

Office Action issued in JP2022028236 on Feb. 6, 2024.
Extended European Search Report issued in EP23156389.1 on Jul. 21, 2023.
Podor et al., Working with the ESEM at high temperature, Materials Characterization, vol. 151, 2019, pp. 15-26.

* cited by examiner

*Primary Examiner* — David P Porta
(74) *Attorney, Agent, or Firm* — The Webb Law Firm

(57) ABSTRACT

Light which is radiant energy is emitted from a sample which is heated, and is detected by a backscattered electron detector. A detection signal from the backscattered electron detector includes a radiant component. A radiant component removal section extracts the radiant component from the detection signal using a filter, and then removes the radiant component from the detection signal. An optical detector which detects the radiant component may be provided. A divided detector may be provided as the backscattered electron detector.

11 Claims, 14 Drawing Sheets

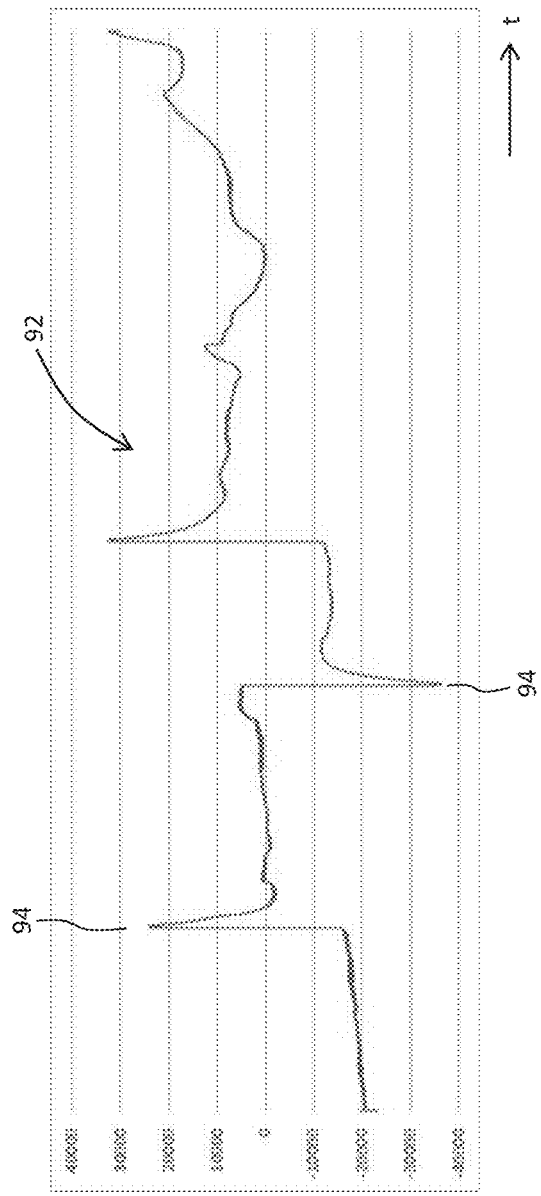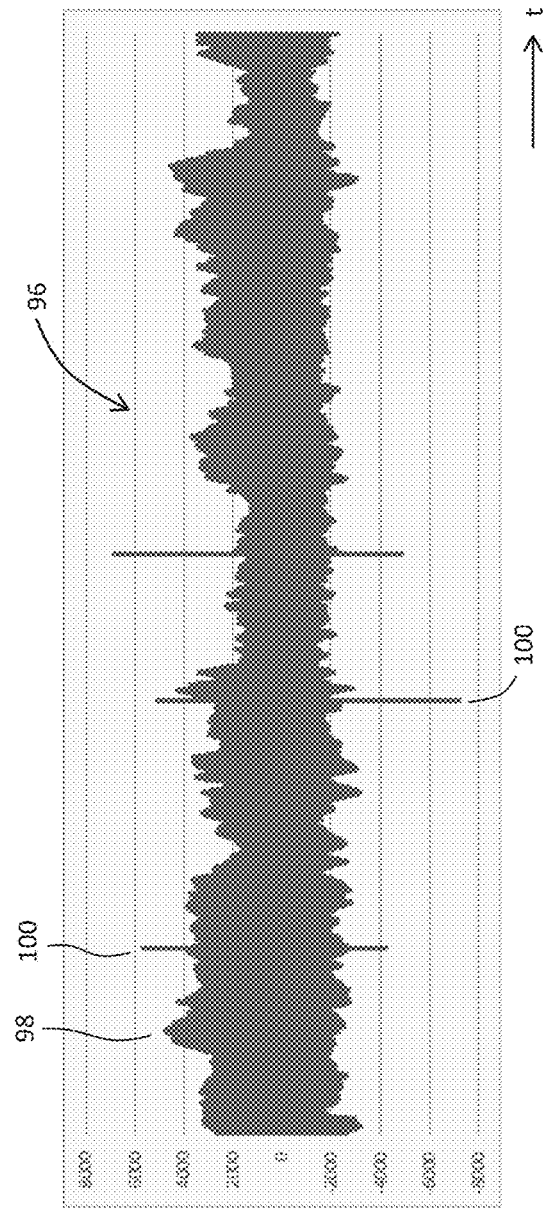

CHARGED PARTICLE BEAM APPARATUS

CROSS REFERENCE TO RELATED APPLICATION

This application claims priority to Japanese Patent Application No. 2022-028236 filed Feb. 25, 2022, the disclosure of which is hereby incorporated by reference in its entirety.

BACKGROUND OF THE DISCLOSURE

Field of the Disclosure

The present disclosure relates to a charged particle beam apparatus, and in particular to a technique for observing a sample which is heated.

Description of Related Art

A charged particle beam apparatus is an apparatus which observes a sample by illuminating the sample with a charged particle beam. Known types of charged particle beam apparatus include a scanning electron microscope, a scanning ion microscope, and the like. In the observation of the sample using the charged particle beam apparatus, the sample is heated as necessary. That is, the sample is observed while the sample is heated, or the sample in the heated state is observed. For example, the sample is heated when observation of a change of strain of a crystal grain is desired or observation of growth of a crystal is desired. A heating temperature is, for example, a few hundreds of ° C. or greater, or a thousand ° C. or greater.

In the scanning electron microscope, electrons emitted from the sample (backscattered electrons, secondary electrons) are detected by a detector (backscattered electron detector, secondary electron detector). When the sample is heated, radiant energy (radiant heat) of an extent to be not ignorable is emitted from the sample and a sample holder; that is, a heated subject. The emission of the radiant energy is specifically emission of light (infrared light, visible light, or the like) as an electromagnetic wave. As the temperature of the sample becomes higher, the amount of radiant energy emitted from the sample is increased.

Normally, the detectors which detect the electrons are also sensitive to photons. Therefore, when the sample is to be observed while the sample is heated, a detection signal which is output from the detector includes, in addition to a component of interest caused by detection of the electrons, a radiant component caused by detection of the radiant energy.

The radiant component in the detection signal causes an offset in the detection signal. In particular, in the case of a sample in a high-temperature state, the radiant component causes a large offset. Further, in this case, because the amount of radiant energy emitted from the sample changes irregularly, the offset in the detection signal becomes unstable. The radiant component included in the detection signal reduces quality of a sample image, and, in some cases, becomes a significant obstructing factor in generating the sample image.

WO 2020/100205 discloses a charged particle beam apparatus having a filter which blocks light from the sample. JP H9-134696 A discloses a scanning electron microscope having a light shielding plate which blocks light from the sample. WO 2020/100205 and JP H9-134696 A do not disclose a technique for removing the radiant component included in the detection signal.

As described above, when the sample in the heated state is to be observed, the radiant energy is emitted from the heated subject (sample, sample holder, and the like) to the detector. The detected radiant energy causes the radiant component. If the sample image is formed based on the detection signal including the radiant component which cannot be ignored, the quality of the sample image is reduced, and, in some cases, it becomes impossible to generate the sample image. Realization of a technique for generating a clear sample image based on the sample in the heated state is desired.

SUMMARY OF THE DISCLOSURE

An advantage of the present disclosure lies in improvement of quality of the sample image in observation of the sample which is heated. Alternatively, an advantage of the present disclosure lies in removal of the radiant component included in the detection signal.

According to one aspect of the present disclosure, there is provided a charged particle beam apparatus comprising: equipment that illuminates a sample with a charged particle beam; a detector that detects a particle of interest emitted from the sample, caused by illumination of the charged particle beam, and that outputs a detection signal including a radiant component caused by detection of radiant energy emitted from a heated subject, caused by heating of the sample; means that identifies the radiant component through a processing of the detection signal or through selective detection of the radiant energy; a remover that removes the radiant component from the detection signal; and a generator that generates an image representing the sample based on the detection signal from which the radiant component is removed.

BRIEF DESCRIPTION OF THE DRAWINGS

Embodiment(s) of the present disclosure will be described based on the following figures, wherein:

FIG. 8 is a diagram showing an example of a radiant component extracted by a filter;

FIG. 9 is a diagram showing an example of a detection signal after removal of the radiant component;

DESCRIPTION OF NON-LIMITING EMBODIMENTS

Figure 1:
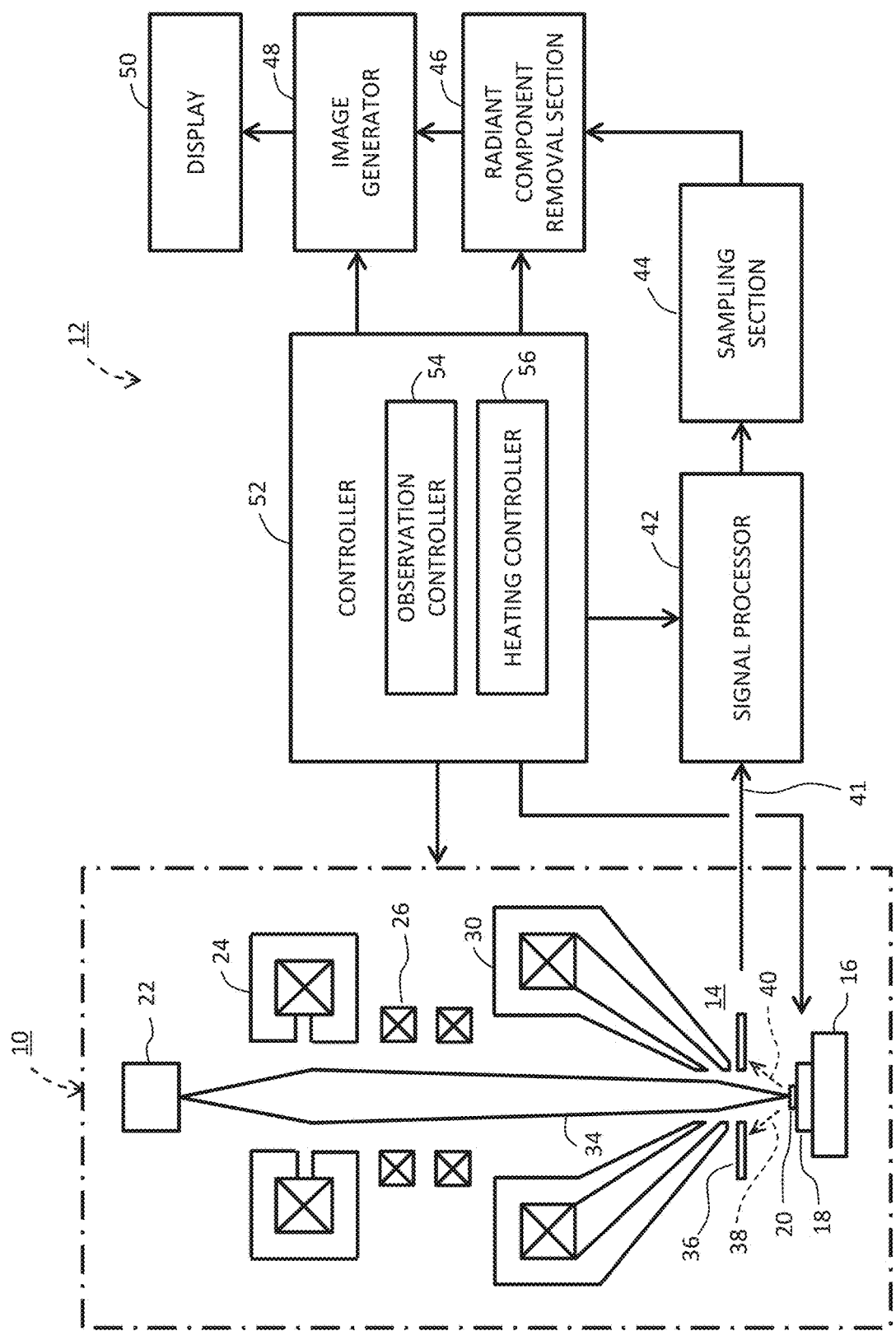
FIG. 1 is a diagram showing an example structure of a scanning electron microscope according to a first embodiment of the present disclosure.

Non-limiting embodiments of the present disclosure will now be described with reference to the drawings.

(1) Overview of Embodiment

A charged particle beam apparatus according to an embodiment of the present disclosure comprises illumination equipment, a detector, means that identifies a radiant component (identifier), a removal section (remover), and a generation section (generator). The illumination equipment illuminates a sample with a charged particle beam. The detector detects a particle of interest emitted from the sample, caused by illumination of the charged particle beam. The detector outputs a detection signal including a radiant component caused by detection of radiant energy emitted from a heated subject, caused by heating of the sample. The means that identifies the radiant component identifies the radiant component through processing of the detection signal or through selective detection of the radiant energy. The removal section removes the radiant component from the detection signal. The generation section generates an image representing the sample based on a detection signal from which the radiant component is removed.

According to the structure described above, because the image can be formed based on the detection signal from which the radiant component is removed, image quality degradation due to the radiant component can be prevented or reduced. As a method of identifying the radiant component, there may be exemplified a method of extracting the radiant component through the processing of the detection signal, and a method of selectively detecting the radiant energy from the heated subject.

In an embodiment of the present disclosure, the charged particle beam is an electron beam. Other examples of the charged particle beam include an ion beam. In an embodiment of the present disclosure, the particle of interest is a backscattered electron or a secondary electron emitted from the sample. Other examples of the particle of interest include ions. The detection of the radiant energy is detection of light. Here, the light may include infrared light, visible light, and ultraviolet light. Alternatively, a thermoelectron may be detected as the radiant energy. When a sample holder for heating is used, the entirety of the sample and the sample holder is the heated subject. Alternatively, only the sample may be heated or only a local site in the sample may be heated. In this case, the sample or the local site is the heated subject.

In an embodiment of the present disclosure, the means that identifies the radiant component includes a filter which extracts the radiant component from the detection signal. In general, the radiant component changes in a short period in response to a change of a sample form, and the particle of interest changes in a long period in response to a change of the sample temperature. The radiant component can be extracted by taking advantage of such a difference in properties. An alternative configuration may be considered in which a filter is used which directly extracts the component of interest from the detection signal.

In an embodiment of the present disclosure, the charged particle beam is two-dimensionally scanned over an observation region which is set on the sample. The detection signal is a one-dimensional signal acquired through the two-dimensional scanning of the charged particle beam. The filter is a one-dimensional filter. The filter is one-dimensionally scanned with respect to the detection signal. The filter is a filter which realizes a smoothing action. Because the change of the temperature is a one-dimensional change caused on a time axis, the one-dimensional filter can be applied to the detection signal which is a one-dimensional signal, and is thus appropriate.

In an embodiment of the present disclosure, the detector has a plurality of detection regions sensitive to the particle of interest and to the radiant energy. A plurality of detection signals are output from the plurality of detection regions in parallel with each other. The charged particle beam apparatus further comprises a plurality of adjusters and a summation device. The plurality of adjusters individually apply gain adjustment and offset adjustment to the plurality of detection signals, respectively, and output a plurality of detection signals after adjustment in parallel with each other. The summation device adds the plurality of detection signals after adjustment, and outputs a detection signal after summation. The detection signal after summation is input to the filter. According to this structure, possibility of occurrence of saturation of the detection signal can be reduced.

In an embodiment of the present disclosure, the detector has a plurality of detection regions sensitive to the particle of interest and to the radiant energy. A plurality of detection signals are output from the plurality of detection regions in parallel with each other. The means that identifies the radiant component includes means which extracts a plurality of radiant component candidates from the plurality of detection signals, and means which identifies the radiant component based on the plurality of radiant component candidates.

While the radiant energies reaching the plurality of detection regions are approximately equal to each other, the number of particles of interest reaching each detection region depends on the sample shape at the time of illumination of the charged particle beam. That is, it is possible to assume that, in the plurality of detection signals which are output from the plurality of detection regions, a common component is the radiant component, and differing components are components of interest. The radiant component is identified from the plurality of radiant component candidates based on such a relationship. For example, a radiant component candidate having the lowest intensity among the plurality of radiant component candidates may be identified as the radiant component. Alternatively, the radiant component may be identified through other methods.

In an embodiment of the present disclosure, the removal section removes the radiant component from the plurality of detection signals. The generation section generates the image representing the sample based on a plurality of detection signals from which the radiant component is removed. Alternatively, a three-dimensional image of the sample may be generated based on the plurality of detection signals from which the radiant component is removed.

In an embodiment of the present disclosure, the detector is a primary detector. The detection signal is a primary detection signal. The means that identifies the radiant component includes a sub detector which selectively detects the radiant energy without detecting the particle of interest. The radiant component is identified based on a sub detection signal which is output from the sub detector. According to this structure, because the radiant component can be selectively detected, the radiant component can be identified with high precision.

In an embodiment of the present disclosure, the sub detector has an incidence film which permits the radiant energy to transmit and which blocks the particle of interest. According to this structure, the radiant component can be easily identified.

In an embodiment of the present disclosure, there are provided a plurality of primary detection regions which function as the primary detector. The removal section removes the radiant component from a plurality of primary detection signals which are output from the plurality of primary detection regions. The generation section generates the image representing the sample based on a plurality of primary detection signals from which the radiant component is removed. The concept of the image includes a three-dimensional image. Alternatively, a divided detector having a plurality of primary detection regions and a plurality of sub detection regions may be used.

(2) Details of Embodiments

FIG. 1 shows an example structure of a charged particle beam apparatus according to a first embodiment of the present disclosure. The charged particle beam apparatus illustrated in FIG. 1 is a scanning electron microscope. Alternatively, the structure to be described below may be applied to a scanning transmission electron microscope, an ion beam apparatus, or the like.

In FIG. 1, the scanning electron microscope has an observer 10 and an information processor 12. The observer 10 has a sample chamber 14. A sample stage 16 is provided in the sample chamber 14, and a sample holder 18 is attached to the sample stage 16. The sample holder 18 holds a sample 20. The observer 10 includes equipment which illuminates an electron beam serving as a charged particle beam.

The sample 20 is, for example, a material such as iron, or a product such as a semiconductor device. The sample holder 18 has a function to heat the sample 20. For example, the entirety or a part of the sample 20 may be heated by applying a current to the entirety of or the part of the sample 20.

The observer 10 has a lens barrel. An electron gun 22, a condenser lens 24, a scanning coil 26, an objective lens 30, or the like is provided in the lens barrel. An electron beam 34 is generated by these elements, and the generated electron beam 34 is illuminated onto the sample 20. The electron beam 34 is two-dimensionally scanned over an observation region which is set on the sample 20. The two-dimensional scanning of the electron beam 34 will be described later in detail with reference to FIG. 2. The sample chamber 14 is provided below the lens barrel.

Through heating of the sample 20, a temperature of the sample 20 is increased. For example, the temperature of the sample 20 changes from room temperature to a temperature greater than or equal to 1000° C. In the embodiment, the sample 20 in the process of temperature increase is continuously or intermittently observed by means of the observer 10. Alternatively, the sample 20 maintained at a certain temperature may be observed. Alternatively, the temperature of the sample in a high-temperature state may be gradually reduced, and the sample 20 may be observed continuously or intermittently during the process of the temperature reduction.

In FIG. 1, the observer 10 has a backscattered electron detector 36. The backscattered electron detector 36 is a semiconductor type detector, and is provided, in the illustrated example structure, at a position above the sample 20 and immediately below the objective lens 30. A secondary electron detector may be provided in addition to or in place of the backscattered electron detector 36.

With the illumination of the sample 20 with the electron beam, backscattered electrons 38 are emitted from the sample. The backscattered electrons 38 are detected by the backscattered electron detector 36. On the other hand, due to the heating of the sample 20, radiant energy, more specifically, light 40 (infrared light, visible light, or the like) is emitted from the sample 20 (more accurately, a heated subject including the sample 20). When the light 40 reaches the backscattered electron detector 36, the detector also detects the light 40.

The detection signal which is output from the backscattered electron detector 36 includes a component of interest (electron component) caused by the detection of the backscattered electron 38, and a radiant component caused by the detection of the light 40. The radiant component varies significantly with the change of temperature of the sample 20. The radiant component causes an offset of the detection signal. When an amount of the radiant energy is increased stepwise during the heating process, the offset level similarly increases stepwise. Normally, the change of the offset level occurs non-continuously or irregularly. The change of the offset level is significantly large in comparison to a change of the component of interest. Thus, in the first embodiment, as will be described below in detail, a structure is employed to remove the radiant component from the detection signal. While the detection signal includes a noise component in addition to the component of interest and the radiant component, the noise component can be removed or suppressed through various publicly-known methods.

Next, the information processor 12 will be described. The information processor 12 is formed from, for example, an electronic circuit and a computer. Each of a signal processor 42 and a sampling section 44 to be described below is formed from an electronic circuit, and each of a radiant component removal section 46, an image generator 48, a controller 52, and the like to be described below is formed from a computer.

The single processor 42 applies a gain adjustment and an offset adjustment on a detection signal 41 in order to realize an appropriate contrast or a desired contrast. The offset adjustment corresponds to a shift of a baseline of the detection signal. Under control of the controller 52, the gain adjustment and the offset adjustment are executed such that saturation is not caused in the detection signal 41, and an amplitude of the detection signal 41 is fitted to a desired dynamic range (for example, an input dynamic range of a sampling section 148 to be described below). An example structure of the signal processor 42 will be described later with reference to FIG. 3.

The detection signal which is output from the signal processor 42 is input to the sampling section 44. The sampling section 44 samples the detection signal; that is, an analog detection signal is converted to a digital detection signal. The sampling section 44 has an A/D (analog-to-digital) converter. A number of quantization bits of the A/D converter is determined such that the saturation is not caused and necessary resolution can be achieved. The detection signal which is output from the sampling section 44 (digital detection signal) is input to the radiant component removal section 46.

The radiant component removal section 46 has a filter which extracts a radiant component in the detection signal. As the filter, there may be employed a filter having a smoothing action such as, for example, an edge-retaining-type smoothing filter. The radiant component removal section 46 removes the extracted radiant component from the detection signal. With this process, a detection signal from which the radiant component is removed is acquired. In this detection signal, the component of interest is dominant. An example structure of the radiant component removal section 46 will be described later in detail with reference to FIG. 4.

The image generator 48 generates an image representing the sample (a backscattered electron image serving as an SEM image) based on the detection signal after the radiant component is removed. Because the radiant component is already removed, image quality degradation due to the radiant component is prevented or reduced. An amplitude value array forming the detection signal is two-dimensionally mapped according to the two-dimensional scanning of the electron beam. With this process, the image is generated.

A display 50 is formed from, for example, a liquid crystal display. The image generated by the image generator 48 is displayed on the display 50. In the process of heating the sample 20, the two-dimensional scanning of the electron beam 34 is repeated. With this process, an image array is generated, and displayed on the display 50. Alternatively, each image forming the image array may be analyzed.

The controller 52 is formed from a processor (for example, a CPU) which executes a program. The controller 52 controls various structures shown in FIG. 1. The controller 52 according to the embodiment functions as an observation controller 54 and a heating controller 56. The observation controller 54 controls operations of various structures in the lens barrel. The heating controller 56 controls the heating of the sample 20. For example, the heating controller 56 controls the heating of the sample 20 such that the temperature change of the sample 20 is a predefined temperature change. A single processor may be employed to function as the controller 52, the radiant component removal section 46, and the image generator 48, or a plurality of processors may be employed to function as the controller 52, the radiant component removal section 46, and the image generator 48.

Alternatively, a secondary electron detector may be provided in place of the backscattered electron detector 36. In this case also, the radiant component included in a detection signal which is output from the secondary electron detector is extracted, and then, the radiant component is removed from the detection signal. A secondary electron image is generated based on the detection signal after the radiant component is removed. Alternatively, both the backscattered electron detector and the secondary electron detector may be provided. Alternatively, a detector other than these detectors may be provided.

Figure 2:
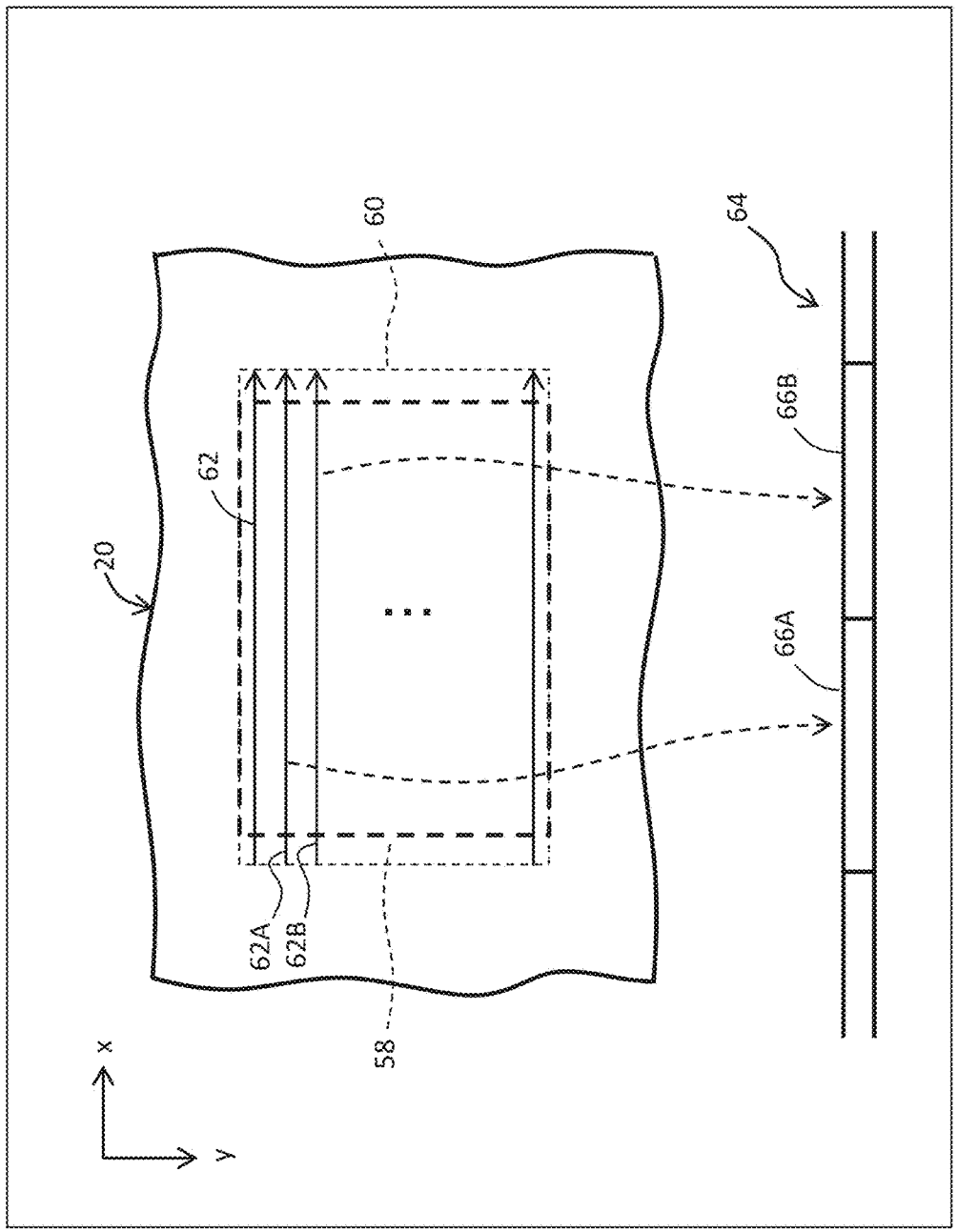
FIG. 2 is a diagram showing a scan region and a detection signal.

A scan region and the detection signal will now be described with reference to FIG. 2. FIG. 2 shows at an upper part an upper surface of the sample 20. An x direction is a primary scanning direction, and a y direction is a sub scanning direction. A region of interest 58 is set on the sample 20 by the user or automatically. The region of interest 58 corresponds to an imaging region. A scan region 60 is defined to contain the region of interest 58. The electron beam is two-dimensionally scanned in the scan region 60.

Reference numeral 62 shows scanning of a first time in the x direction. The scanning in the x direction is performed at each position in the y direction. In some cases, a so-called interlaced scanning is performed. The scan region 60, which is larger than the region of interest 58, is determined in order to image a stable scan region; that is, in order to exclude a strain due to responsiveness (delay in switching of the magnetic field) of the scanning coil from a target of imaging.

A detection signal 64 shown at a lower part of FIG. 2 is formed from a plurality of signal segments corresponding to a plurality of scans along the x direction. For example, a signal segment 66A is acquired through execution of a scan 62A, and a signal segment 66B is acquired through execution of a subsequent scan, scan 62B. The two signal segments 66A and 66B are timewise continuous in the detection signal 64. While the electron beam is two-dimensionally scanned, the detection signal acquired through the two-dimensional scan is a one-dimensional signal on the time axis, similar to the one-dimensional signal showing the change of the sample temperature.

Figure 3:
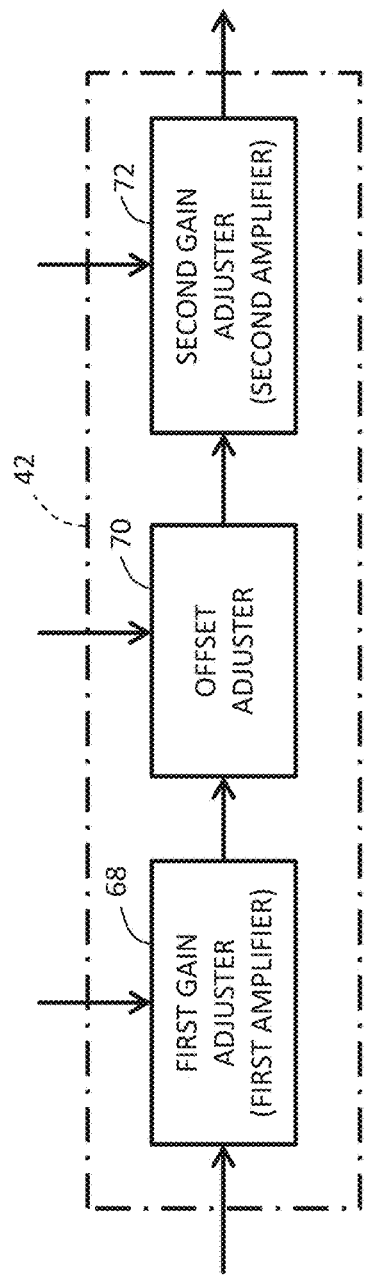
FIG. 3 is a diagram showing an example structure of a signal processor.

FIG. 3 shows an example structure of the signal processor 42 shown in FIG. 1. The signal processor 42 is formed from a first gain adjuster (first amplifier) 68, an offset adjustor 70, and a second gain adjuster (second amplifier) 72. In consideration that the detection signal may include the radiant component, and that occurrence of saturation in the detection signal should be avoided, the detection signal is first amplified with a low amplification in the first gain adjuster 68, and then the offset adjustment is applied to the amplified detection signal. For example, when a level of the radiant component is increased, the offset of the detection signal is reduced in correspondence thereto. After the offset adjustment, the detection signal is amplified by the second gain adjuster 72. With this process, necessary contrast can be secured.

Operations of the first gain adjuster 68, operations of the offset adjuster 70, and operations of the second gain adjuster 72 are controlled by the controller. In this case, the operations of the adjusters 68, 70, and 72 may be feedback-controlled while referring to the detection signal. Alternatively, the detection signal may be amplified using three or more amplifiers.

The level of the radiant component is unstable, and, in particular, the degree of instability is increased as the temperature of the sample is increased. For example, in order to avoid occurrence of saturation due to the increase of the level of the radiant component, the gains of the first gain adjuster 68 and the second gain adjuster 72 may be set low. In either case, it is difficult to remove the influences of the radiant component solely through the offset adjustment, and a process to remove the radiant component from the detection signal is necessary.

Figure 4:
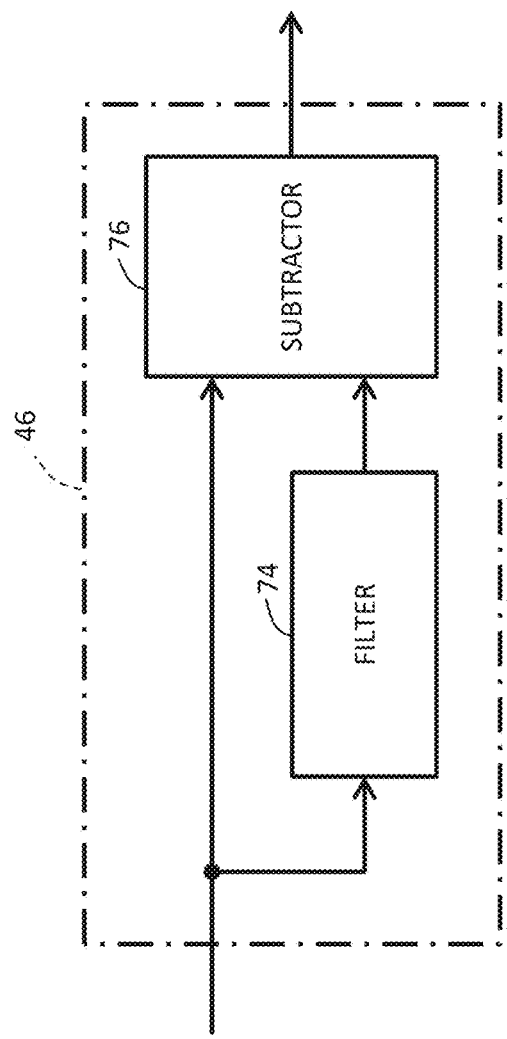
FIG. 4 is a diagram showing an example structure of a radiant component removal section.

FIG. 4 shows an example structure of the radiant component removal section 46. The radiant component removal section 46 has a filter 74 and a subtractor 76. The filter 74 is for extracting (identifying) the radiant component included in the detection signal. The filter 74 is a one-dimensional filter having a smoothing action or a low-pass action. More specifically, as the filter 74, there may be employed a low-pass filter, a moving average filter, an edge-retaining-type smoothing filter, and the like. As the edge-retaining-type smoothing filter, there may be exemplified a bilateral filter, a non-local means filter, and the like.

The radiant component extracted by the filter 74 is sent to the subtractor 76. The subtractor 76 subtracts (removes) the radiant component from the detection signal, to thereby generate a detection signal from which the radiant component is removed. A sequence of processes described above is performed for each set of data arranged on the time axis. In the moving average process, a weighted average may be calculated.

Figure 5:
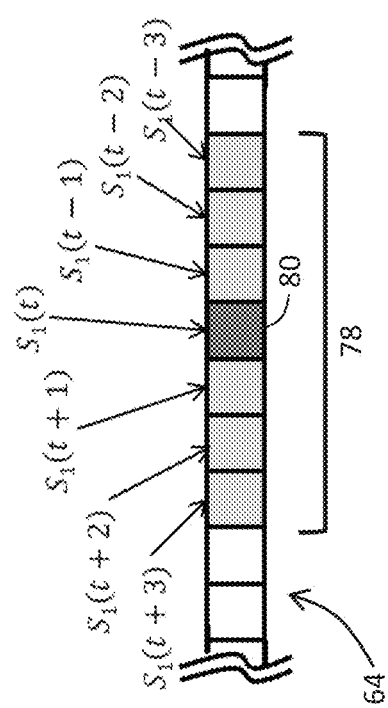
FIG. 5 is a diagram for explaining an action of a filter.

When the moving average filter is used as the filter, as shown in FIG. 5, a plurality of sets of data arranged in a time sequential order are sequentially set as data of interest $S1(t)$. With the data of interest $S1(t)$ as a center, a one-dimensional window 78 is set. Data $S1(t+3)$~$S1(t-3)$ in the window 78 are referred to, and an average value Fd(t) determined therefrom is set as a value of new data of interest $S1(t)$. More specifically, the following calculation shown in Equation (1) is executed. In the illustrated example configuration, w is three (w=3).

[Equation 1]

$$Fd(t) = \frac{\begin{array}{c}S_1(t-3)+S_1(t-2)+S_1(t-1)+\\ S_1(t)+S_1(t+1)+S_1(t+2)+S_1(t+3)\end{array}}{(2w+1)} \quad (1)$$

When the bilateral filter is used as the filter, for example, the following calculation shown in Equation (2) is executed.

[Equation 2]

$$Fd(t) = \frac{\sum_{n=-w}^{w} S_1(t+n)\exp\left(-\frac{n^2}{2\sigma_1^2}\right)\exp\left(-\frac{(S_1(t)-S_1(t+n))^2}{2\sigma_2^2}\right)}{\sum_{n=-w}^{w} \exp\left(-\frac{n^2}{2\sigma_1^2}\right)\exp\left(-\frac{(S_1(t)-S_1(t+n))^2}{2\sigma_2^2}\right)} \quad (2)$$

Here, w is a parameter defining a size of the window, and σ1 and σ2 are respectively parameters for adjusting the action of the filter.

Figure 6:
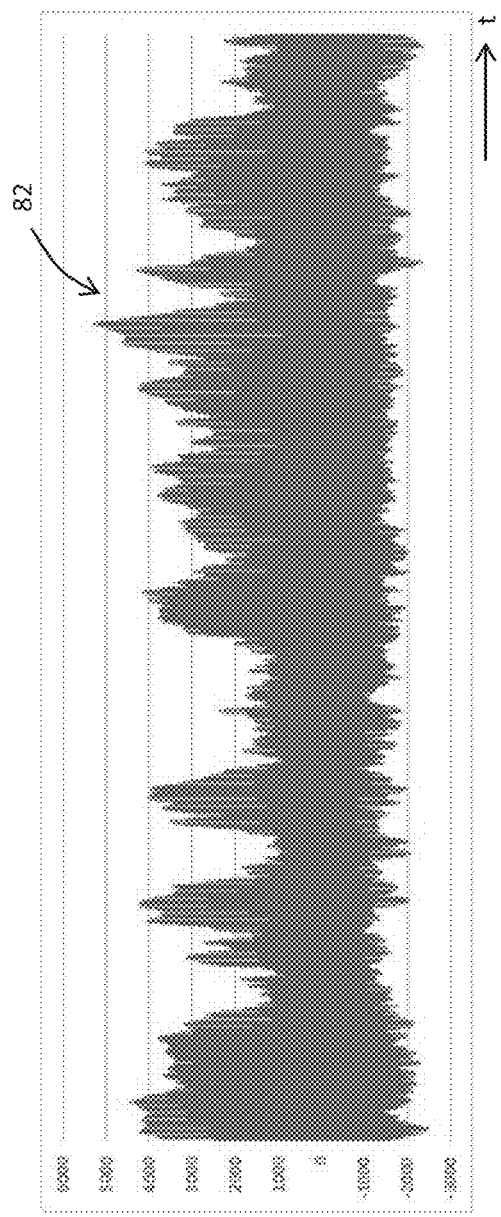
FIG. 6 is a diagram showing an example of a detection signal acquired under a non-heated condition.

With reference to FIGS. 6 to 9, a specific example of signal processing will be described. FIG. 6 shows a detection signal 82 before heating. The horizontal axis represents a time axis, and the vertical axis represents an amplitude axis. Two-dimensional scanning of the electron beam is repeatedly executed on the sample, and a signal acquired through this process is the detection signal 82. The detection signal 82 includes a large number of fine waveforms reflecting the sample shape. In the detection signal 82, the influence of the radiant component is small and is ignorable.

Figure 7:
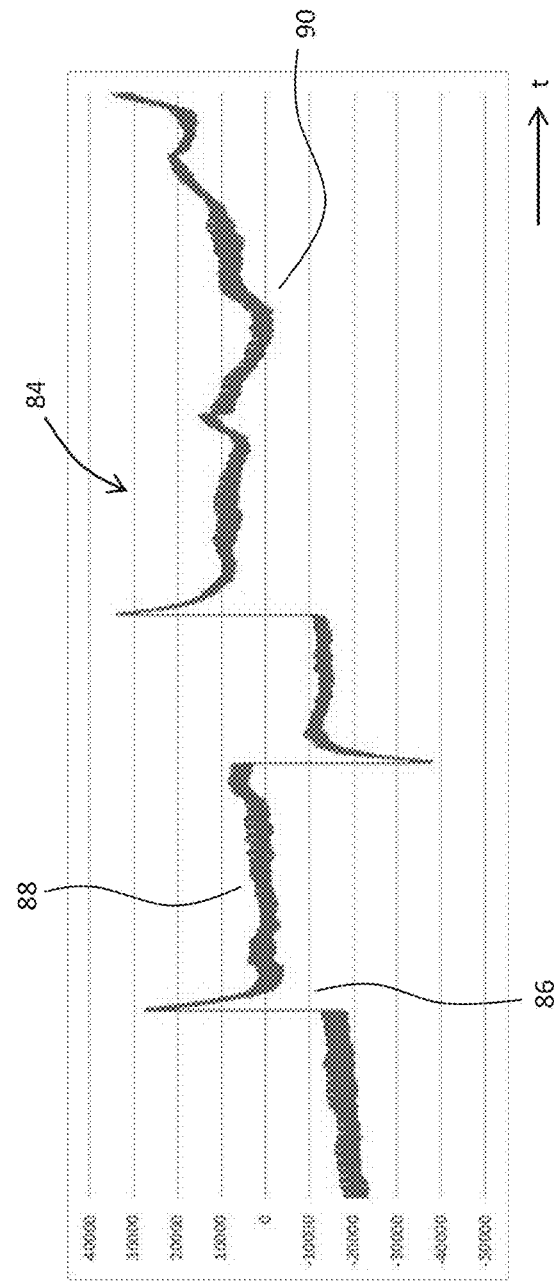
FIG. 7 is a diagram showing an example of a detection signal acquired under a heated condition.

FIG. 7 shows a detection signal 84 acquired during the heating process. The detection signal 84 includes a radiant component, and specifically, a significant offset is caused in the detection signal 84. The offset includes a portion 88 which is approximately flat, but also includes a portion 86 which rapidly changes, and an unstable portion 90. A portion which appears thick in the detection signal 84 corresponds to the component of interest reflecting the sample shape. As described above, this portion is formed from a large number of fine changes. It should be noted that the scale of the vertical axis shown in FIG. 7 differs from the scale of the vertical axis shown in FIG. 6.

It can be deduced that the portion 86 is caused when an internal structure of the sample rapidly changes due to the heating of the sample, and that the portion 90 is caused when the internal structure of the sample changes continuously or irregularly. In either case, the radiant component is a significant obstructing factor in imaging the sample.

FIG. 8 shows a radiant component 92 extracted by the filter. The radiant component 92 corresponds to a basic form or a baseline of the detection signal shown in FIG. 7. The radiant component 92 includes a pulsed portion 94.

FIG. 9 shows a detection signal 96 after removal of the radiant component. The offset due to the radiant component has mostly disappeared, and the detection signal as a whole is within a certain amplitude range. The substance of the detection signal 96 is a large number of waveforms 98 reflecting the sample shape. As is clear from comparison of the scale of the vertical axis shown in FIG. 9 and the scales of the vertical axes shown in FIGS. 7 and 8, the contrast of the detection signal 96 is significantly increased.

The detection signal 96 includes several peaks 100. These peaks are remains of the pulsed portions shown in FIG. 8. Each peak 100 corresponds to a noise of about one pixel, and is not significant in view of the image as a whole. However, as will be described later, a suppression process may be applied to the peaks.

Figure 10:
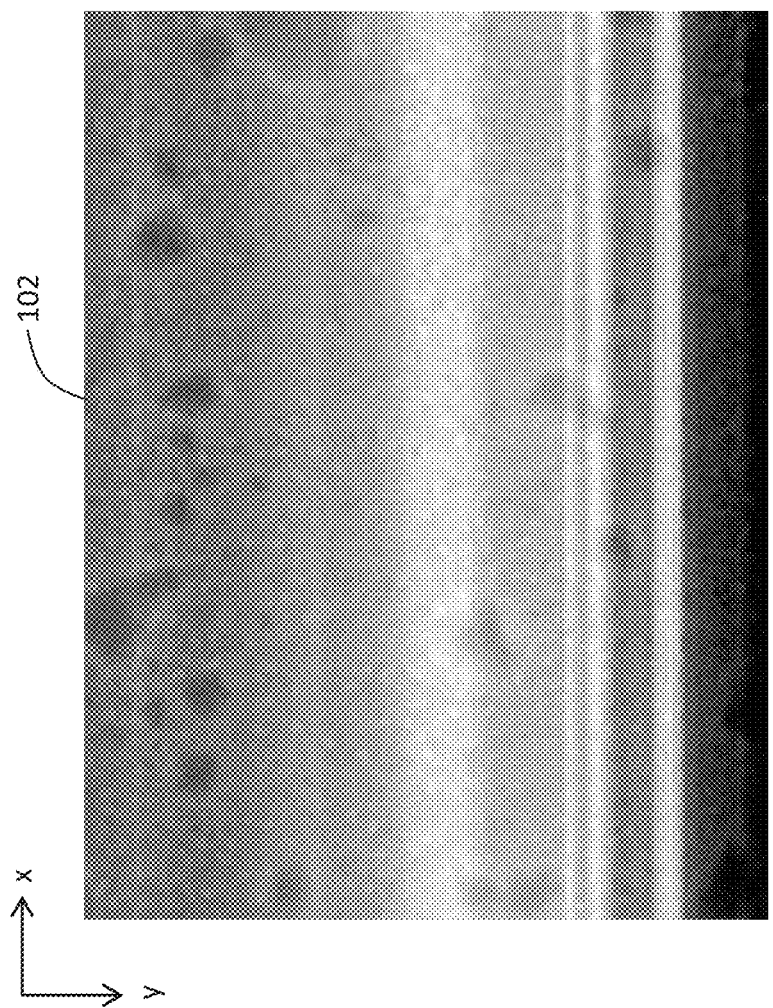
FIG. 10 is a diagram showing an example of an image generated based on a detection signal including a radiant component.

FIG. 10 shows an image 102 generated based on the detection signal having the radiant component. Several lateral stripes appear in the image 102, and the image 102 as a whole is unclear.

Figure 11:
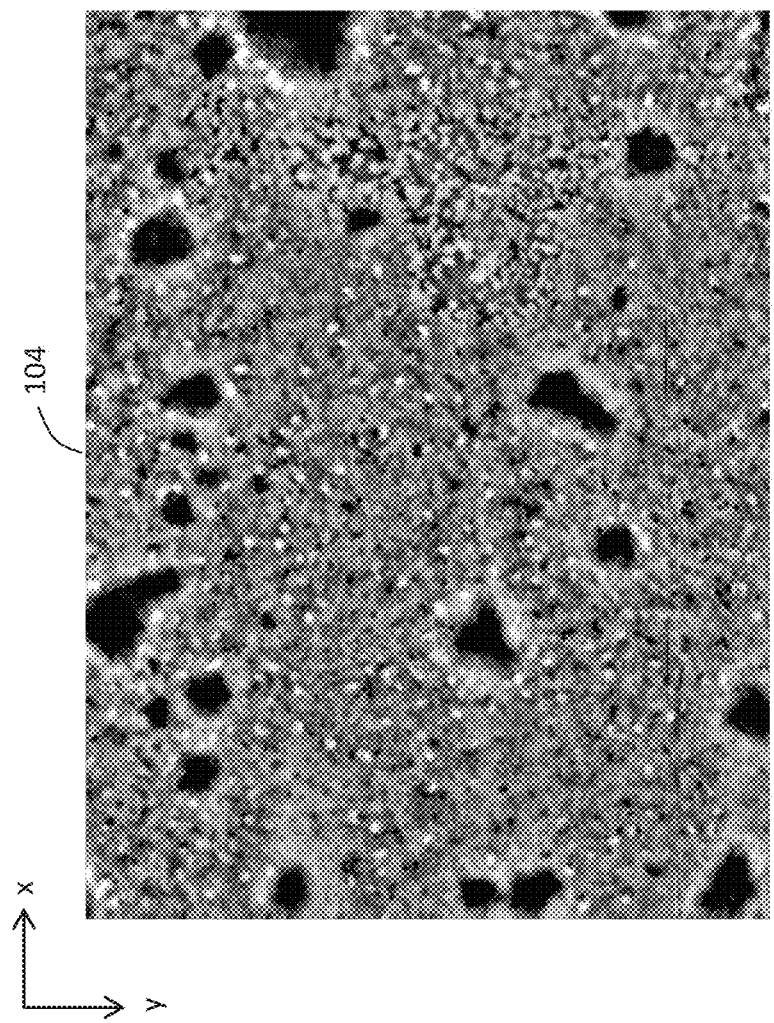
FIG. 11 is a diagram showing an example of an image generated based on a detection signal after removal of the radiant component.

FIG. 11 shows an image 104 generated based on the detection signal after the removal of the radiant component. The image 104 has a sufficient contrast, and has superior clarity.

Figure 12:
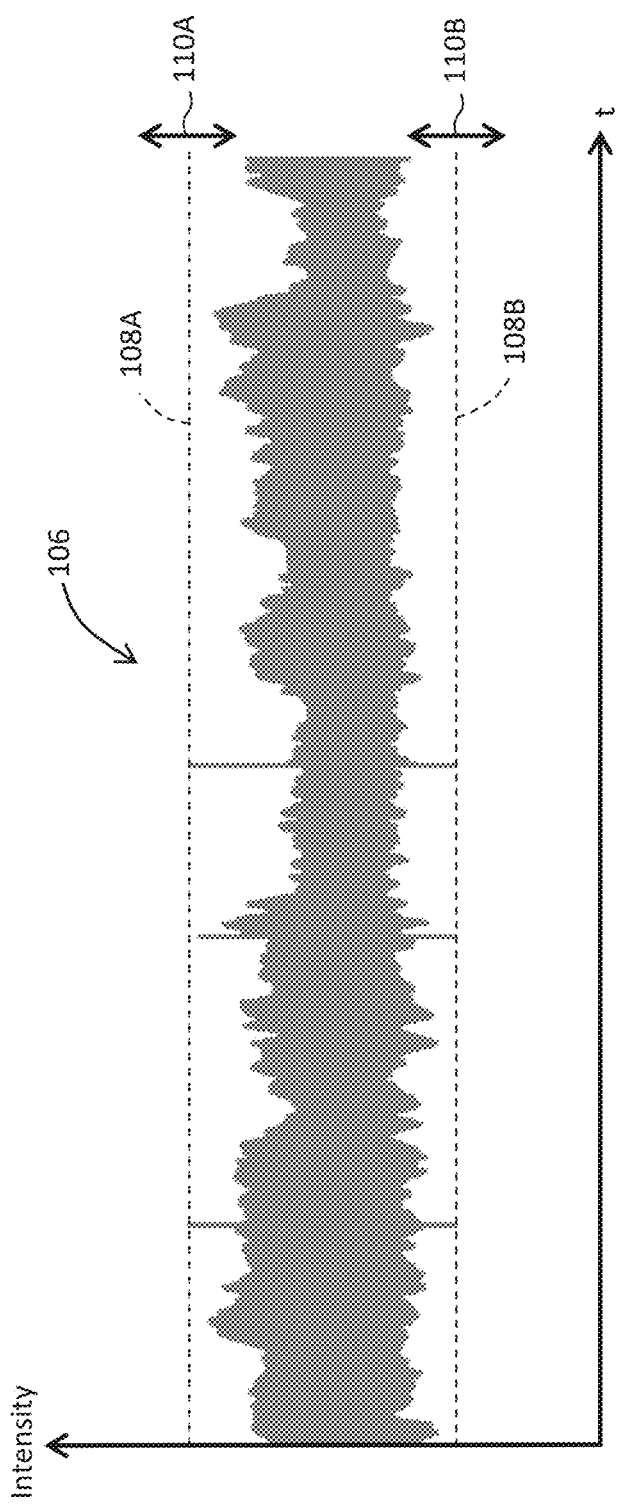
FIG. 12 is a diagram showing an example of processing on a detection signal after removal of the radiant component.

As shown in FIG. 12, a clipping process may be applied to a detection signal 106 after the removal of the radiant component. The clipping process is, for example, a process to cut portions above a first threshold 108A and portions below a second threshold 108B. As shown by reference numerals 110A and 110B, the first threshold 108A and the second threshold 108B may be varied by the user or automatically. Alternatively, other processes (including other filtering processes) may be applied to the detection signal in place of the clipping process.

Figure 13:
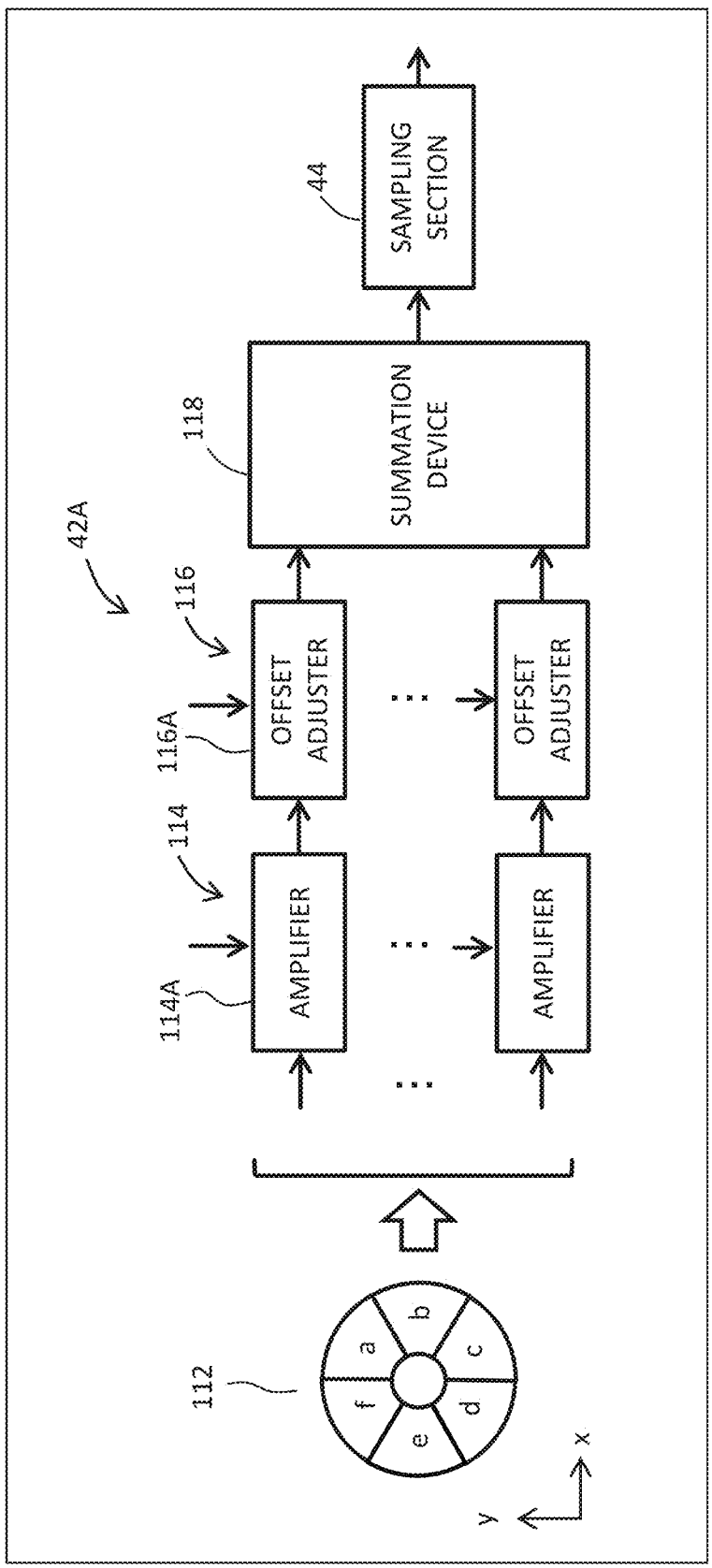
FIG. 13 is a diagram showing a first alternative configuration of the first embodiment of the present disclosure.

FIG. 13 shows a first alternative configuration of the first embodiment of the present disclosure. A detector 112 which detects the backscattered electrons is a so-called divided detector. In the illustrated example structure, the detector 112 has six regions including regions a to f. Each individual region a to f functions as an independent detection element. Six detection signals are output from the detector 112, in parallel with each other.

A signal processor 42A has an amplifier array 114, an offset adjuster array 116, and a summation device 118. The amplifier array 114 is formed from six amplifiers 114A, and the offset adjuster array 116 is formed from six offset adjusters 116A. Each detection signal is amplified by the amplifier 114A. Then, for each detection signal, the offset adjustment is applied by the respective offset adjuster 116A. Six detection signals after these adjustments are added by the summation device 118. The detection signal after the summation is output to the sampling section 44. The structures after the sampling section 44 are identical to the structures after the sampling section 44 shown in FIG. 1.

When the structure shown in FIG. 13 is employed, an advantage can be obtained in that it becomes more difficult for saturation of the detection signal to occur. That is, because an area of each individual region a to f is small, the amount of radiant energy experienced by each individual region is also small. With this configuration, it becomes more difficult for saturation due to the radiant component to occur in a stage before the summation.

Figure 14:
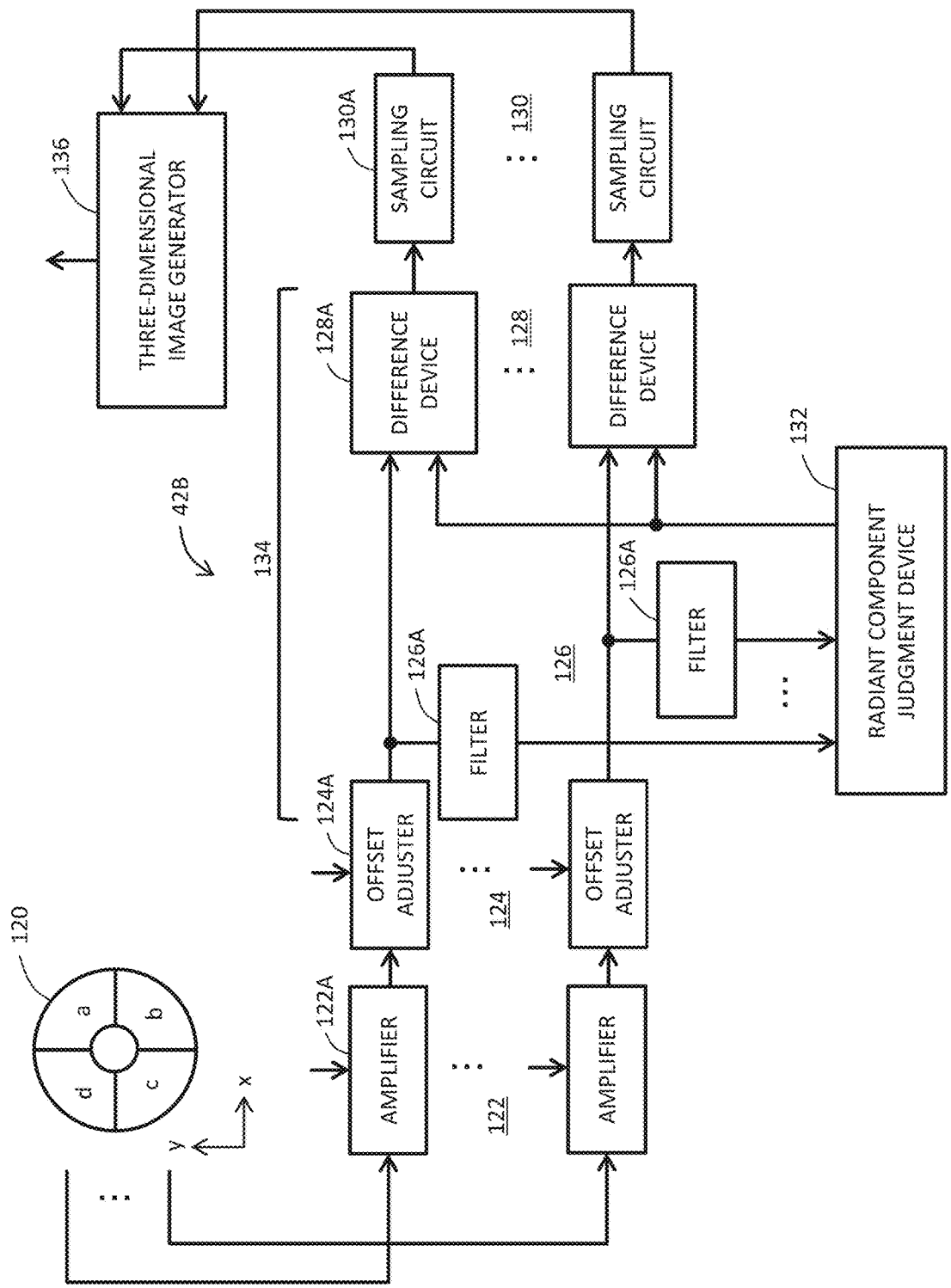
FIG. 14 is a diagram showing a second alternative configuration of the first embodiment of the present disclosure.

FIG. 14 shows a second alternative configuration of the first embodiment of the present disclosure. In the illustrated example structure, a divided detector 120 has four regions a to d. Each region a to d functions as a detection element. Four detection signals are output from the divided detector 120, in parallel with each other.

A signal processor 42B has an amplifier array 122, an offset adjuster array 124, a filter array 126, a difference device array 128, and a radiant component judgment device 132. The amplifier array 122 is formed from four amplifiers 122A, the offset adjuster array 124 is formed from four offset adjusters 124A, the filter array 126 is formed from four filters 126A, and the difference device array 128 is formed from four difference devices 128A.

Each filter 126A is a filter which extracts the radiant component (a radiant component candidate in the second alternative configuration). With the actions of the four filters 126A, four radiant component candidates are extracted from four detection signal, in parallel with each other. The radiant component judgment device 132 judges (identifies) a radiant component candidate, among the four radiant component candidates, having the minimum amplitude value as the radiant component.

The radiant energy from the heated subject is emitted approximately equivalently in the periphery, and the amounts of the radiant energy received by the four regions a to d may be assumed to be approximately equal to each other. The four detection signals may be assumed to include the radiant component common to the four regions. On the other hand, depending on the sample shape at the time of illumination of the electron beam, the amounts of backscattered electrons received by the regions a to d vary. Thus, a part exceeding the common radiant component may be considered to correspond to the component of interest. Based on this idea, the radiant component candidate having the minimum level among the four radiant component candidates is judged as the radiant component. The level is compared at each individual time. Alternatively, processes such as smoothing may be applied to the radiant component candidates prior to the level comparison.

In each difference device 128A, the radiant component is subtracted from each detection signal. With this process, four detection signals from which the radiant component is removed are generated. The difference device array 128 corresponds to the radiant component removal section.

A sampling section 130 is formed from four sampling circuits 130A. Each detection signal is sampled by the respective sampling circuit 130A. With this process, four detection signals after sampling are generated. A three-dimensional image generator 136 generates a three-dimensional image representing the sample based on these detection signals.

In this case, a publicly-known Photometric Stereo (PS) method may be employed. In this method, an image three-dimensionally representing the surface of the sample is generated utilizing a difference in emission angles of the electrons among a plurality of detection regions. Alternatively, a three-dimensional image of the sample may be constructed through other methods. In this case also, the above-described radiant component removal technique may be applied.

Figure 15:
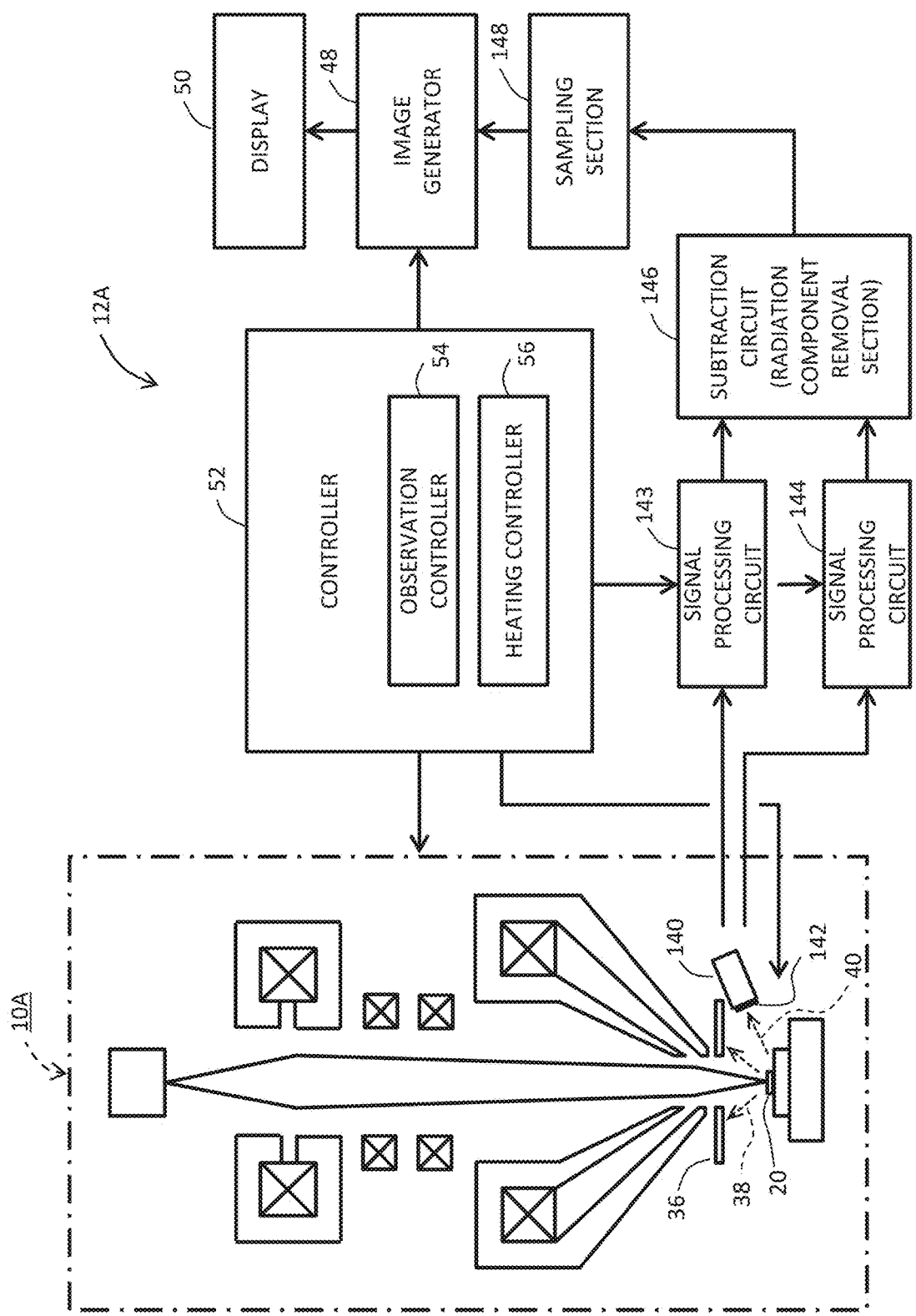
FIG. 15 is a diagram showing an example structure of a scanning electron microscope according to a second embodiment of the present disclosure.

FIG. 15 shows an example structure of a scanning electron microscope according to a second embodiment of the present disclosure. In FIG. 15, elements similar to those shown in FIG. 1 are assigned the same reference numerals, and their descriptions will not be repeated.

In the sample chamber, a photodetector 140 is provided. A light receiving surface of the photodetector 140 is covered with an electron shielding film 142. The electron shielding film 142 is a selective transmission film which permits light to transmit and blocks the electrons, and is formed from, for example, glass or a transparent resin. A charging prevention process (conductive process) is applied on a surface of the electron shielding film 142.

In the backscattered electron detector 36, the backscattered electrons are detected, and the radiant energy; that is, the light, is detected. On the other hand, in the photodetector 140, only the radiant energy; that is, the light, is detected. A first detection signal which is output from the backscattered electron detector 36 includes a component of interest and a radiant component. A second detection signal which is output from the photodetector 140 basically includes only the radiant component. The second detection signal may be assumed to be a radiant component signal.

A signal processing circuit 143 is a circuit which performs gain adjustment and offset adjustment on the first detection signal. A signal processing circuit 144 is a circuit which performs gain adjustment and offset adjustment on the second detection signal. The detection signals are adjusted such that the radiant component included in the first detection signal and the radiant component included in the second detection signal are equal to each other.

A subtraction circuit 146 is a circuit which subtracts the second detection signal from the first detection signal. With this process, a detection signal after removal of the radiant component is acquired. The subtraction circuit 146 functions as the radiant component removal section. The subtraction circuit 146 may alternatively be called a difference device. The detection signal after the removal of the radiant component is sent through the sampling section 148 to the image generator 48.

In the second embodiment also, the radiant component in the detection signal (first detection signal) can be effectively removed. In the second embodiment, because the light caused by the radiation is directly detected, the radiant component can be identified with high precision. Alternatively, a mechanism which moves the photodetector 140 may be provided as necessary. The mechanism places the photodetector 140 at a predetermined position in the sample chamber during the use of the photodetector 140, and retracts the photodetector 140 to a retracted position when the photodetector 140 is not used.

Figure 16:
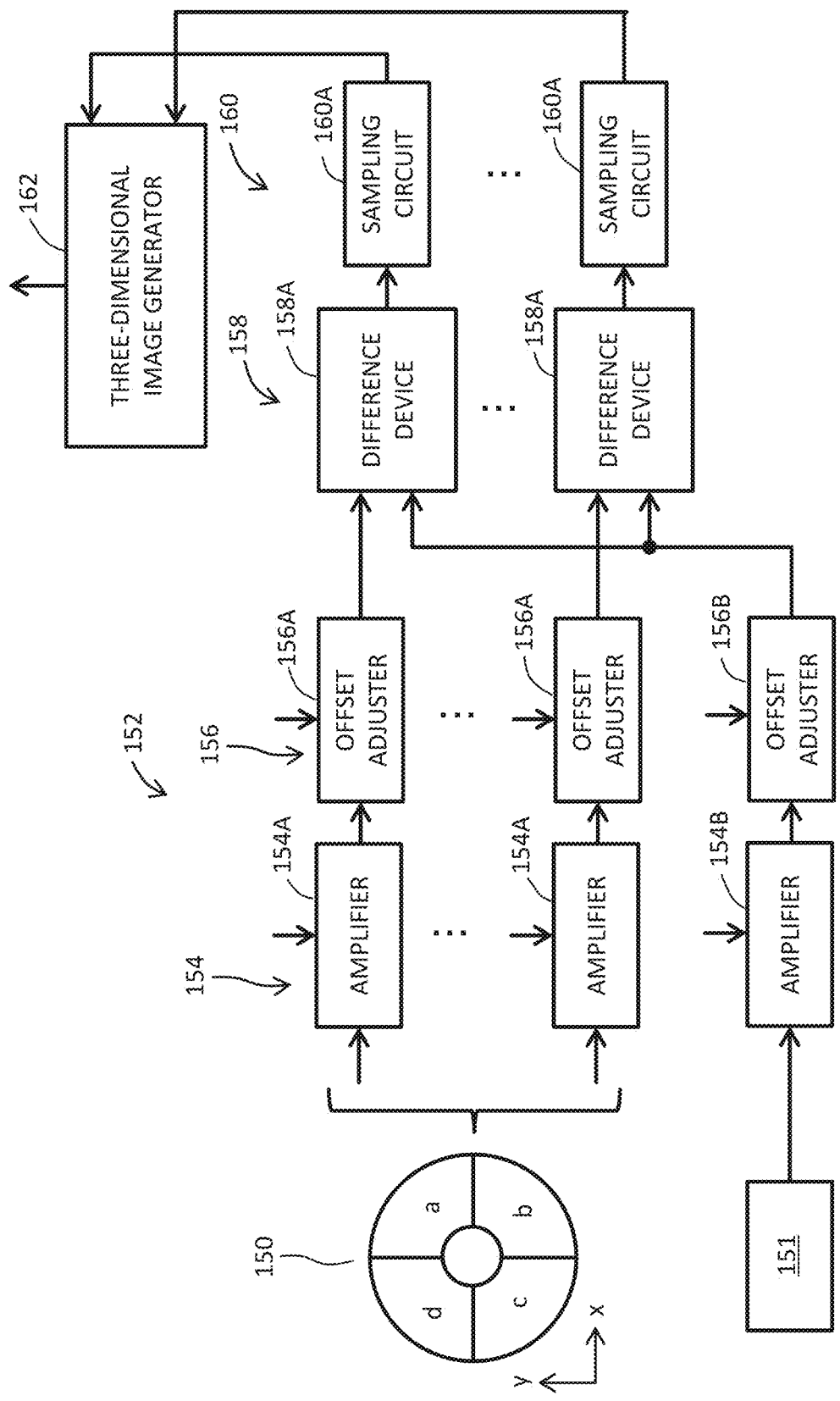
FIG. 16 is a diagram showing a first alternative configuration of the second embodiment of the present disclosure.

FIG. 16 shows a first alternative configuration of the second embodiment of the present disclosure. A backscattered electron detector 150 is a divided detector, and has four regions a to d. A photodetector 151 is provided separately from the backscattered electron detector 150. An electron shielding film is provided on a light receiving surface of the photodetector 151.

A signal processor 152 has an amplifier array 154, an offset adjuster array 156, and a difference device array 158. The amplifier array 154 is formed from four amplifiers 154A and an amplifier 154B, and the offset adjuster array 156 is formed from four offset adjusters 156A and an offset adjuster 156B. The difference device array 158 is formed from four difference devices 158A.

Four first detection signal which are output from the backscattered electron detector 150 in parallel with each other are amplified by the four amplifiers 154A, and offset adjustment is applied by the four offset adjusters 156A on the four first detection signal after the amplification.

On the other hand, a second detection signal which is output from the photodetector 151 is amplified by the amplifier 154B, and offset adjustment is applied by the offset adjuster 156B on the second detection signal after the amplification. The plurality of difference devices 158A respectively subtract the second detection signal after the offset adjustment from the four first detection signals after the offset adjustment. With this process, four detection signals after removal of the radiant component are acquired. These signals are sent to a three-dimensional image generator 162. The three-dimensional image generator 162 generates a three-dimensional image of the sample based on the PS method described above, or the like.

Alternatively, the gain adjustment and the offset adjustment may be applied to the four detection signals after the second detection signal is subtracted from the four first detection signals.

Figure 17:
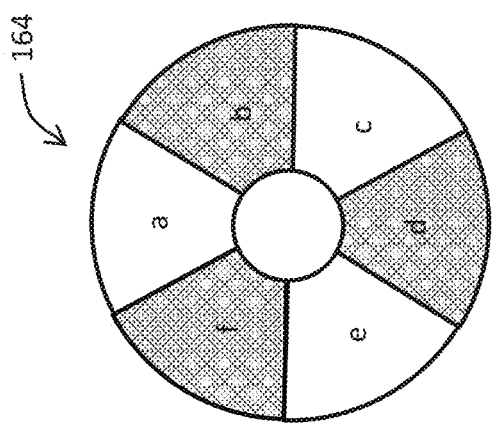
FIG. 17 is a diagram showing a second alternative configuration of the second embodiment of the present disclosure.

FIG. 17 shows a second alternative configuration of the second embodiment of the present disclosure. Specifically, a divided detector 164 shown in FIG. 17 may be provided in place of the backscattered electron detector 36 and the photodetector 140 in the structure shown in FIG. 15. The divided detector 164 has a plurality of regions a to f which are arranged in an annular manner. The regions a to f have the same area with each other. The regions a, c, and e function as detection elements for backscattered electron detection, and regions b, d, and f function as detection elements for light detection. Regions b, d, and f are covered with a selective transmission film which blocks electrons and which permits the light to transmit. Alternatively, three first detection signals which are output from the regions a, c, and e may be added after being individually processed. Similarly, three second detection signals which are output from the regions b, d, and f may be added after being individually processed. By setting the areas of the regions a to f to be equal to each other, the gains of the detection signals can be set to the same gain, facilitating the subtraction of the radiant component.

Figure 18:
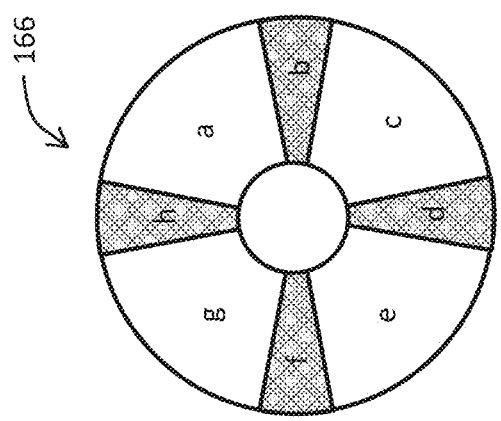
FIG. 18 is a diagram showing a third alternative configuration of the second embodiment of the present disclosure.

FIG. 18 shows a third alternative configuration of the second embodiment of the present disclosure. Specifically, a divided detector 166 shown in FIG. 18 may be provided in place of the backscattered electron detector 150 and the photodetector 151 in the structure shown in FIG. 16. The divided detector 166 has a plurality of first regions a to h arranged in an annular manner. The first regions a, c, e, and g have relatively large areas, and function as detection elements for backscattered electron detection. Second regions b, d, f, and h have relatively small areas, and function as detection elements for light detection. Each of the second regions b, d, f, and h is covered with an electron shielding film. Three second detection signals which are output from the regions b, d, and f may be added after being individually processed. The second detection signal after the summation is subtracted from four first detection signals which are output from the regions b, d, f, and h. A three-dimensional image is generated based on the four detection signals after the removal of the radiant component. When the third alternative configuration is employed, the plurality of first regions and the plurality of second regions are placed such that a rotational symmetry is realized.

Alternatively, a secondary electron detector may be employed as a photodetector. In this case, a high negative potential may be applied to a detection window (electrode) of the secondary electron detector, so that electrons (secondary electrons, backscattered electrons) do not reach the detection window. Light transmitting through the detection window is detected as a current signal by an action of a photomultiplier tube. The current signal is a signal representing the radiant component. Alternatively, detection of thermoelectrons may be considered for identifying the radiant component. Alternatively, the structure described above may be applied to a scanning transmission electron microscope or to other observation apparatuses.

The invention claimed is:

1. A charged particle beam apparatus comprising:
   equipment that illuminates a sample with a charged particle beam;
   a detector that detects a particle of interest emitted from the sample, caused by illumination of the charged particle beam, and that outputs a detection signal comprising a radiant component caused by detection of radiant energy emitted from a heated subject, caused by heating of the sample;
   an identifier that identifies the radiant component through a processing of the detection signal or through selective detection of the radiant energy;
   a remover that removes the radiant component from the detection signal; and
   a generator that generates an image representing the sample based on a detection signal from which the radiant component is removed.

2. The charged particle beam apparatus according to claim 1, wherein
   the charged particle beam is an electron beam,
   the particle of interest is a backscattered electron or a secondary electron emitted from the sample, and
   the detection of the radiant energy is detection of light.

3. The charged particle beam apparatus according to claim 1, wherein
   the identifier comprises a filter which extracts the radiant component from the detection signal.

4. The charged particle beam apparatus according to claim 3, wherein
   the charged particle beam is two-dimensionally scanned over an observation region which is set on the sample,
   the detection signal is a one-dimensional signal acquired through the two-dimensional scanning of the charged particle beam,
   the filter is a one-dimensional filter, and
   the filter is one-dimensionally scanned with respect to the detection signal.

5. The charged particle beam apparatus according to claim 3, wherein
   the filter is a filter which realizes a smoothing action.

6. The charged particle beam apparatus according to claim 3, wherein
   the detector has a plurality of detection regions sensitive to the particle of interest and to the radiant energy,
   a plurality of detection signals are output from the plurality of detection regions in parallel with each other,
   the charged particle beam apparatus further comprises:
   a plurality of adjusters that individually apply gain adjustment and offset adjustment on the plurality of detection signals, and that output a plurality of detection signals after adjustment in parallel with each other; and
   a summation device that adds the plurality of detection signals after adjustment and that outputs a detection signal after summation, and
   the detection signal after summation is input to the filter.

7. The charged particle beam apparatus according to claim 3, wherein
   the detector has a plurality of detection regions sensitive to the particle of interest and to the radiant energy,
   a plurality of detection signals are output from the plurality of detection regions in parallel with each other, and the identifier extracts a plurality of radiant component candidates from the plurality of detection signals, and identifies the radiant component based on the plurality of radiant component candidates.

8. The charged particle beam apparatus according to claim 7, wherein
the remover removes the radiant component from the plurality of detection signals, and
the generator generates the image representing the sample based on a plurality of detection signals from which the radiant component is removed.

9. The charged particle beam apparatus according to claim 1, wherein
the detector is a primary detector,
the detection signal is a primary detection signal,
the identifier comprises a sub detector which selectively detects the radiant energy without detecting the particle of interest, and
the radiant component is identified based on a sub detection signal which is output from the sub detector.

10. The charged particle beam apparatus according to claim 9, wherein
the sub detector has an incidence film which permits the radiant energy to transmit and which blocks the particle of interest.

11. The charged particle beam apparatus according to claim 9, wherein
a plurality of primary detection regions functioning as the primary detector are provided,
the remover removes the radiant component from a plurality of primary detection signals which are output from the plurality of primary detection regions, and
the generator generates the image representing the sample based on a plurality of primary detection signals from which the radiant component is removed.

* * * * *